US011531056B2

(12) United States Patent
Escher-Poeppel et al.

(10) Patent No.: US 11,531,056 B2
(45) Date of Patent: Dec. 20, 2022

(54) PREDICTIVE CHIP-MAINTENANCE

(71) Applicant: Infineon Technologies AG, Neubiberg (DE)

(72) Inventors: Irmgard Escher-Poeppel, Duggendorf (DE); Thorsten Meyer, Regensburg (DE); Gerhard Poeppel, Duggendorf (DE)

(73) Assignee: Infineon Technologies AG, Neubiberg (DE)

( * ) Notice: Subject to any disclaimer, the term of this patent is extended or adjusted under 35 U.S.C. 154(b) by 95 days.

(21) Appl. No.: 16/849,931

(22) Filed: Apr. 15, 2020

(65) Prior Publication Data

US 2021/0325445 A1    Oct. 21, 2021

(51) Int. Cl.
| | | |
|---|---|---|
| *G01R 31/26* | (2020.01) | |
| *G01R 31/28* | (2006.01) | |
| *G01R 31/316* | (2006.01) | |
| *H01L 23/60* | (2006.01) | |

(52) U.S. Cl.
CPC ..... *G01R 31/2644* (2013.01); *G01R 31/2632* (2013.01); *G01R 31/2843* (2013.01); *G01R 31/2874* (2013.01); *G01R 31/316* (2013.01); *H01L 23/60* (2013.01)

(58) Field of Classification Search
None
See application file for complete search history.

(56) References Cited

U.S. PATENT DOCUMENTS

| | | | |
|---|---|---|---|
| 9,494,657 B2 | 11/2016 | Khan et al. | |
| 9,726,554 B1 | 8/2017 | Ghantous et al. | |
| 9,739,824 B2 | 8/2017 | Graas et al. | |
| 10,389,141 B2 * | 8/2019 | Roumi | H02J 7/00 |
| 10,955,464 B2 * | 3/2021 | Fiore | G01R 31/2834 |
| 11,275,110 B2 * | 3/2022 | Elian | G01R 31/2896 |
| 2006/0109034 A1 | 5/2006 | Okitsu | |
| 2006/0139822 A1 | 6/2006 | Kurita et al. | |
| 2008/0197870 A1 | 8/2008 | Koerner | |
| 2014/0103937 A1 | 4/2014 | Khan et al. | |
| 2014/0214354 A1 | 7/2014 | Dreifus et al. | |

(Continued)

FOREIGN PATENT DOCUMENTS

EP    1398639 A2    3/2004

OTHER PUBLICATIONS

Office Action from U.S. Appl. No. 16/849,868 dated May 24, 2021, 15 pp.

(Continued)

*Primary Examiner* — Jermele M Hollington
(74) *Attorney, Agent, or Firm* — Shumaker & Sieffert, P.A.

(57) ABSTRACT

The disclosure describes to techniques for detecting field failures or performance degradation of circuits, including integrated circuits (IC), by including additional contacts, i.e. terminals, along with the functional contacts that used for connecting the circuit to a system in which the circuit is a part. These additional contacts may be used to measure dynamic changing electrical characteristics over time e.g. voltage, current, temperature and impedance. These electrical characteristics may be representative of a certain failure mode and may be an indicator for circuit state-of-health (SOH), while the circuit is performing in the field.

28 Claims, 8 Drawing Sheets

(56) References Cited

U.S. PATENT DOCUMENTS

| | | | | |
|---|---|---|---|---|
| 2014/0226248 | A1* | 8/2014 | Hameed | H02H 3/044 |
| | | | | 361/115 |
| 2016/0258994 | A1 | 9/2016 | Graas et al. | |
| 2017/0108552 | A1 | 4/2017 | Roumi et al. | |
| 2017/0264123 | A1* | 9/2017 | Mulawski | H02J 7/00714 |
| 2017/0331162 | A1 | 11/2017 | Clarke et al. | |
| 2017/0350936 | A1* | 12/2017 | McMeen | G01R 31/2817 |
| 2018/0313893 | A1 | 11/2018 | Fiore et al. | |
| 2018/0348304 | A1 | 12/2018 | Tang et al. | |
| 2019/0162745 | A1 | 5/2019 | Otsuki et al. | |
| 2021/0311129 | A1* | 10/2021 | Yezerets | G01R 31/392 |
| 2021/0325454 | A1* | 10/2021 | Elian | G01R 31/2896 |

OTHER PUBLICATIONS

U.S. Appl. No. 16/849,868, filed Apr. 15, 2020, naming inventors Elian et al.

Blanchard et al., "Using ESD Diodes as Voltage Clamps," analog.com, retrieved from retrieved from https://www.analog.com/en/analog-dialogue/articles/esd-diodes-as-voltage-clamps.html on Feb. 20, 2019, 12 pp. document previously uploaded on Apr. 15, 2020.

Response to Office Action dated May 24, 2021, from U.S. Appl. No. 16/849,868, filed Aug. 24, 2021, 11 pp.

Blanchard et al., "Using ESD Diodes as Voltage Clamps," analog.com, retrieved from https://www.analog.com/en/analog-dialogue/articles/esd-diodes-as-voltage-clamps.html on February 202, 2019, 12 pp.

"AND8231-D, Circuit Configuration Options for TVS Diodes," onsemi.com, Mar. 2017, 5 pp.

Duvvury et al., "ESD Protection Device Issues for IC Designs," Proceedings of the IEEE 2001 Custom Integrated Circuits Conference (Cat. No. 01CH37169), May 9, 2001, pp. 41-48.

Frenzel, "Save Your ICs from Dreaded ESD," electronicdesign.com, May 8, 2018, 11 pp.

Keim, "How to Use a Diode as a Thermometer," allaboutcircuits.com, Feb. 16, 2018, 6 pp.

"IDDQ Testing," anysilicon.com, Mar. 31, 2016, 1 pp.

"IDDQ Testing Made Easy," Systems Science, Inc., Jan. 2, 1997, 32 pp.

"IDDQ Tutorial," Digital Test Methods, Chapter 13, 1997 (Applicant points out, in accordance with MPEP 609.04(a), that the year of publication, 1997, is sufficiently earlier than the effective U.S. filing date, so that the particular month of publication is not in issue.) pp. 13/1-13/30.

Tsai et al., "An Efficient RDL Routing for Flip-Chip Designs," edn.com, Aug. 20, 2013, 3 pp.

"Thermal Copper Pillar Bump," Wikipedia, the free encyclopedia, retrieved from https://en.wikipedia.org/wiki/Thermal_copper_pillar_bump, May 21, 2019, 3 pp.

Morris et al., "New Sendyne IC and Module Monitors Ground Fault, Isolation, Current, Voltage and Temperature," chargedevs.com, Apr. 13, 2016, 6 pp.

Notice of Allowance from U.S. Appl. No. 16/849,868, dated Nov. 12, 2021, 9 pp.

\* cited by examiner

PREDICTIVE CHIP-MAINTENANCE

TECHNICAL FIELD

The disclosure relates reliability testing of integrated circuits.

BACKGROUND

The performance of semiconductor devices may degrade or fail during operational use, which is sometimes called a field failure. In some examples, the performance of a semiconductor device may degrade over time without a detectable field failure. In applications requiring high reliability, such as commercial aircraft, automobiles, trains, power grids and similar applications, reliability concerns may be mitigated, for example by replacing certain components at regular intervals. Scheduled replacement, however, can be expensive, and scheduled replacement of semiconductor components may occur for components that are still fully functional.

In other examples, components used in high reliability applications may be subject to stringent design and testing requirements, which may significantly increase the component cost. In other examples, systems in high reliability applications may include additional sensors for early detection of failures or degradation of system components.

SUMMARY

In general, the disclosure describes to techniques for detecting field failures or performance degradation of circuits, including integrated circuits (IC), by including additional contacts, i.e. terminals, along with functional contacts used for connecting the circuit to a system in which the circuit is a part. These additional contacts may be used to measure dynamic changing characteristics over time e.g. voltage, current, temperature and impedance. These electrical characteristics may be representative of a certain failure mode and may be an indicator for circuit state-of-health (SOH), while the circuit is performing in the field.

In one example, the disclosure describes a device comprising: a circuit configured to perform one or more circuit operations, and an additional terminal comprising a circuit test element, wherein the circuit test element is located between the circuit and the additional terminal, and wherein a change over time of a measured electrical characteristic at the additional terminal indicates a state of health (SOH) of the circuit.

In another example, the disclosure describes system comprising: a circuit package comprising: a circuit, the circuit configured to perform one or more circuit operations, an additional terminal comprising a circuit test element. The circuit test element is located between the circuit and the additional terminal, and a change over time of an electrical characteristic measured at the additional terminal indicates a state of health (SOH) of the circuit package. The system further includes a measurement device configured to: measure the electrical characteristic, and electrically connect to the additional terminal, wherein the measurement device is configured to determine the change over time of the electrical characteristic while the circuit is performing the one or more circuit operations.

In one example, the disclosure is directed to a method comprising: connecting a measurement device to a power supply terminal of a circuit package configured to perform one or more circuit operations outside of a test environment, connecting the measurement device to an additional terminal comprising a circuit test element, wherein the circuit test element is located between the power supply terminal of the circuit package and the additional terminal, measuring an electrical characteristic between the power supply terminal and the additional terminal at a first time, measuring the electrical characteristic between the power supply terminal and the additional terminal at a second time subsequent to the first time, comparing the electrical characteristic determined at the first time to the electrical characteristic determined at the second time, determining a state of health (SOH) of the circuit package outside of the test environment based on a change in the electrical characteristic determined at the first time to the electrical characteristic determined at the second time.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to techniques for detecting field failures or performance degradation of integrated circuit (IC) components by including additional test contacts, e.g., test terminals, along with the functional contacts. These additional contacts may be inside the IC package or external to the package surface and are used to measure dynamic changing electrical characteristics over time e.g. voltage, current, capacity, temperature or impedance. The electrical characteristics being measured may be representative of a certain failure mode and may be treated inside the IC or by a signal to a system that includes the IC, as indicator for product state-of-health (SOH). Some examples of issues that may cause component degradation or eventual failure may include vibration, extreme changes in temperature, and moisture, to name a few.

In some examples, long-term thermal changes may induce metal phase change separation, cause void generation within the IC package, and possibly cause delamination and breakage of electrical connections such as wire bonds and solder bonds connecting the IC package to a system. The environment may also cause long-term induced degradation of package materials, e.g. mold materials and glues but also metal plating. Package material degradation may contribute to humidity penetrating the IC package and possibly accelerate corrosion effects inside the package. In other examples, metal migration effects may lead to short circuits internally, or between IC terminals connected by solder or wire bonds to the system.

In the example of a ball-grid array (BGA) the corner balls may be susceptible to cracking because corner balls are exposed to the greatest thermo-mechanical stress. As a result, cracks may form in the solder joint, which grow increasingly and could eventually lead to failure. For this reason, corner balls in a BGA may be designed only as mechanical fixings in large blocks, and in some cases corner balls be otherwise electrically isolated and not further connected electrically. According to one or more techniques of this disclosure, a corner position of an IC package may be used for current measurement or to measure other electrical properties. Some examples of a corner position may include corner balls of a BGA, a corner of a sinterlayer or, in the case of flip chips, corner pillars or corner bumps. Use of a corner ball as a test terminal may provide the IC component the capability to observe and evaluate increasing cracking by measuring a decreasing current flow.

To protect against electrostatic discharge (ESD), ICs may include ESD protection diodes to clamp ESD voltages to a non-damaging level. ESD protection diodes may be used to measure temperature. For example, an additional contact on the IC may be used to measure the IC temperature by monitoring a voltage on one or more ESD diodes. The temperature may be compared to a temperature range or threshold to detect an increasing risk for errors, e.g. temperature changes caused by increasing resistance on terminal bonds caused by crack formation that may creep or propagate through the electrical joint over time, or temperature changes caused by increasing thermal resistance.

Figure 1:
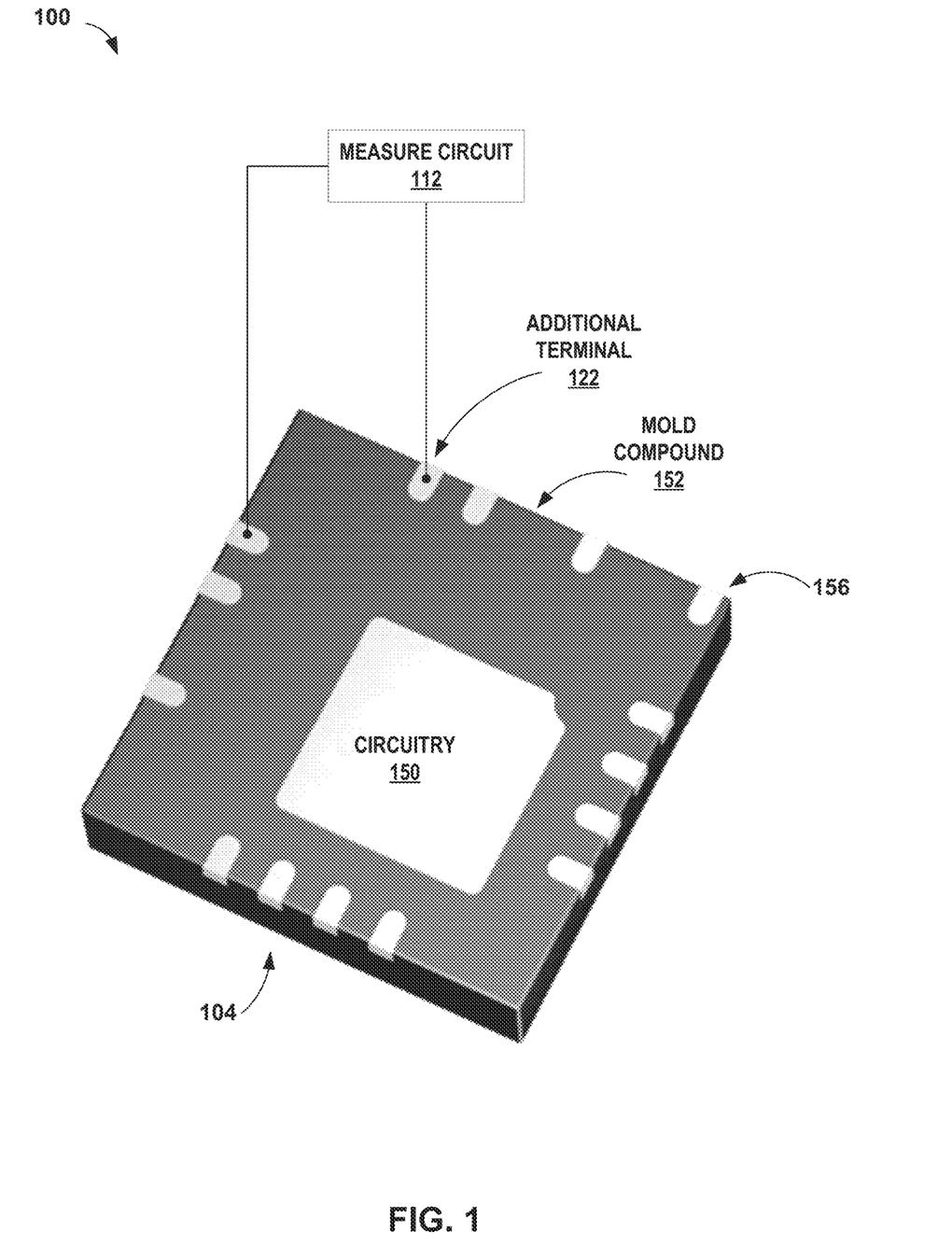
FIG. 1 is a conceptual diagram illustrating a system for measuring an electrical characteristic between terminals of a circuit according to one or more techniques of this disclosure.

FIG. 1 is a conceptual diagram illustrating a system for measuring an electrical characteristic between terminals of a circuit according to one or more techniques of this disclosure. System 100 may include measure circuit 112 connected to circuit package 104. Measure circuit 112 may be part of a measurement device configured to measure one or more electrical characteristics, such as current, voltage, temperature, impedance and other characteristics. In some examples, measure circuit 112 may be configured to determine a change over time of the measured electrical characteristic. In some examples, system 100 may be part of a device or equipment operating outside of a test environment or manufacturing environment. For example, system 100 may be part of a vehicle, such as an automobile, locomotive, aircraft, maritime vehicle, or oil drilling or research platform. In other examples system 100 may be part of an energy management installation, such as wind power, solar power, or similar installations. Circuit package 104 may therefore perform various circuit operations while in the field, e.g. in situ. Measure circuit 112 may be configured to determine the electrical characteristics during normal circuit operations outside of a test environment, e.g. without being connected to automated test equipment (ATE) in a manufacturing setting.

Circuit package 104 may include circuitry 150, and a plurality of external terminals such as corner terminal 156 and additional terminal 122. In the example of FIG. 1, circuit package 104 is depicted as an integrated circuit (IC) with circuitry 150 at least partially encapsulated by mold compound 152. However, the techniques of this disclosure may apply to a variety of circuits and systems and are not limited only to ICs. Some examples of circuits may include power circuits such as power switching circuits with metal oxide semiconductor field effect transistors (MOSFET), voltage regulator circuits, DC-DC converters, AC-DC converters and DC-AC converters, gate driver ICs, motor control ICs, intelligent power modules (IPM), relay drivers, half-bridge and H-bridge driver circuits, power management ICs, application specific integrated circuits (ASIC), and a variety of other types of circuits. In some examples, circuitry 150 may include complementary metal oxide semiconductor (CMOS) circuits.

Circuit package 104 may include a variety of external terminals to connect circuitry 150 to other components of system 100. Some examples of external terminals may include power input terminals to provide power to circuitry 150, a reference terminal, which in some examples may be a signal ground or other ground terminal, and a variety of functional terminals including input/output (I/O) terminals, connections to external components, and other terminals that may simply provide mechanical support. In the example of an IC with connections to external components, some external components such as inductors, timing crystals, large capacitors, and similar components, may be mounted near circuit package 104 rather than included as part of circuit package 104. In this disclosure a "terminal" may also be referred to as a "pin." and may refer to any type of electrical connection point including solder balls, pillars, and similar connections.

A circuit of this disclosure may also include additional terminal 122, which may be coupled a circuit test element. In some examples, the circuit test element (not shown in FIG. 1) may be located between circuitry 150 and additional terminal 122 or some other external terminal. Some examples of a circuit test element may include a resistance, a diode, or similar element. In some examples, the resistance may be an inherent resistance of the connection between additional terminal 122 and circuitry 150, or another external terminal. In the example of a resistor as a circuit test element, by applying a voltage to additional terminal 122, measure circuit 112 may determine a magnitude of current at additional terminal 122.

In some examples, measure circuit 112 may compare the measured electrical characteristic to a predetermined threshold, which may indicate a state of health (SOH) of circuit package 104. For example, a leakage current that exceeds a predefined current magnitude may indicate an increased risk of circuit failure in the near future. In other examples, a change over time of a measured electrical characteristic at additional terminal 122 may indicate a state of health circuit package 104. For example, an increase in operating temperature from an average operating temperature may indicate a change in the state of health of circuit package 104.

In some examples, additional terminal 122 may be located at a position that is more vulnerable to connection damage than other external terminals. As one example, additional terminal 122 may be located at a corner position, such as at corner terminal 156. A corner terminal, such as a corner ball of a Ball Grid Array (BGA) package, a corner terminal of a leadless package, a corner pillar or bump on a flip chip package, may be more vulnerable to stress then other terminals. Therefore, measuring electrical characteristics of an additional terminal at corner terminal 156 may provide an early indication of potential stress or degradation at other terminals of IC package 104. For example, a decrease in measure current over time for a given applied voltage may indicate an increase in resistance, which may be caused by cracking in a solder joint.

Some examples of mechanical stress may be caused by vibration, shock, twisting forces, thermo-mechanical forces and other stress that may cause an electrical connection interface to degrade. For example, changes in temperature, such as in an aircraft leaving a runway on a warm day and climbing to higher altitudes where the temperature quickly drops to sub-zero may subject a system to thermal stress. Similarly, changes in seasons for an automobile, a solar grid array or other equipment may cause thermal stress.

In the example of FIG. 1, circuit package 104 includes an encapsulant such as mold compound 152. Measure circuit 112 may apply a voltage between two or more external terminals that are not electrical connected. An increase in current over time may indicate leakage through the encapsulant, such as may be caused by absorbing moisture, delamination, metal migration or other causes. In this example, the circuit test element may include mold compound 152, as for example, a "resistive" element that is expected to have high impedance. In some examples, measure circuit 112 may apply an alternating current (AC) stimulus to the additional terminals to measure and AC impedance and detect leakage.

In some examples, additional terminal 122 configures circuit package 104 to allow Iddq testing while in the field and outside a test environment. Iddq testing is a technique for testing CMOS integrated circuits for the presence of faults. It relies on measuring the supply current (Idd) in the quiescent state, e.g. when the circuit is not switching and inputs are held at static values. The current consumed in the state may be called Iddq for Idd (quiescent). Iddq testing may be done for circuits during manufacturing to weed out defective parts before being assembled into a larger system. The techniques of this disclosure give system 100 the ability to perform Iddq testing while the circuit is installed and operating in the field. Therefore, including circuits with an additional terminal, provides system 100 an advantage because system 100 may test for and receive an early indication of a pending malfunction in circuit package 104.

In general, Iddq testing uses the principle that in a correctly operating quiescent CMOS digital circuit, has no static current path between the power supply and ground, except for a small amount of leakage. Many semiconductor faults may cause the current to increase. Iddq testing may have the advantage of checking a circuit for many possible faults with one measurement. Some examples of defects that Iddq may detect include bridges between circuits, breaks in continuity, transistor stuck-on (T-SON), transistor stuck open (SOP), new transistor created, and other defects.

An Iddq test may not determine exactly which portion of circuitry 150 may be developing a defect. But, by controlling the functional I/O pins of circuit package 104, system 100 may perform periodic Iddq tests. A change over time of Iddq magnitude for circuit package 104 may indicate an impending malfunction. Another advantage is that Iddq tests may catch faults that may not found by stuck-at fault test vectors. As with other electrical characteristic, even similar circuits in similar applications may have variations in specific values. Therefore, in some examples, by measuring a trend of Iddq values, system 100 may determine the state of health of circuit package 104 by comparing a change in Iddq magnitude to a change threshold. System 100 may trigger an alarm, a warning or other indication when a change in Iddq magnitude exceeds the change threshold.

Figure 2:
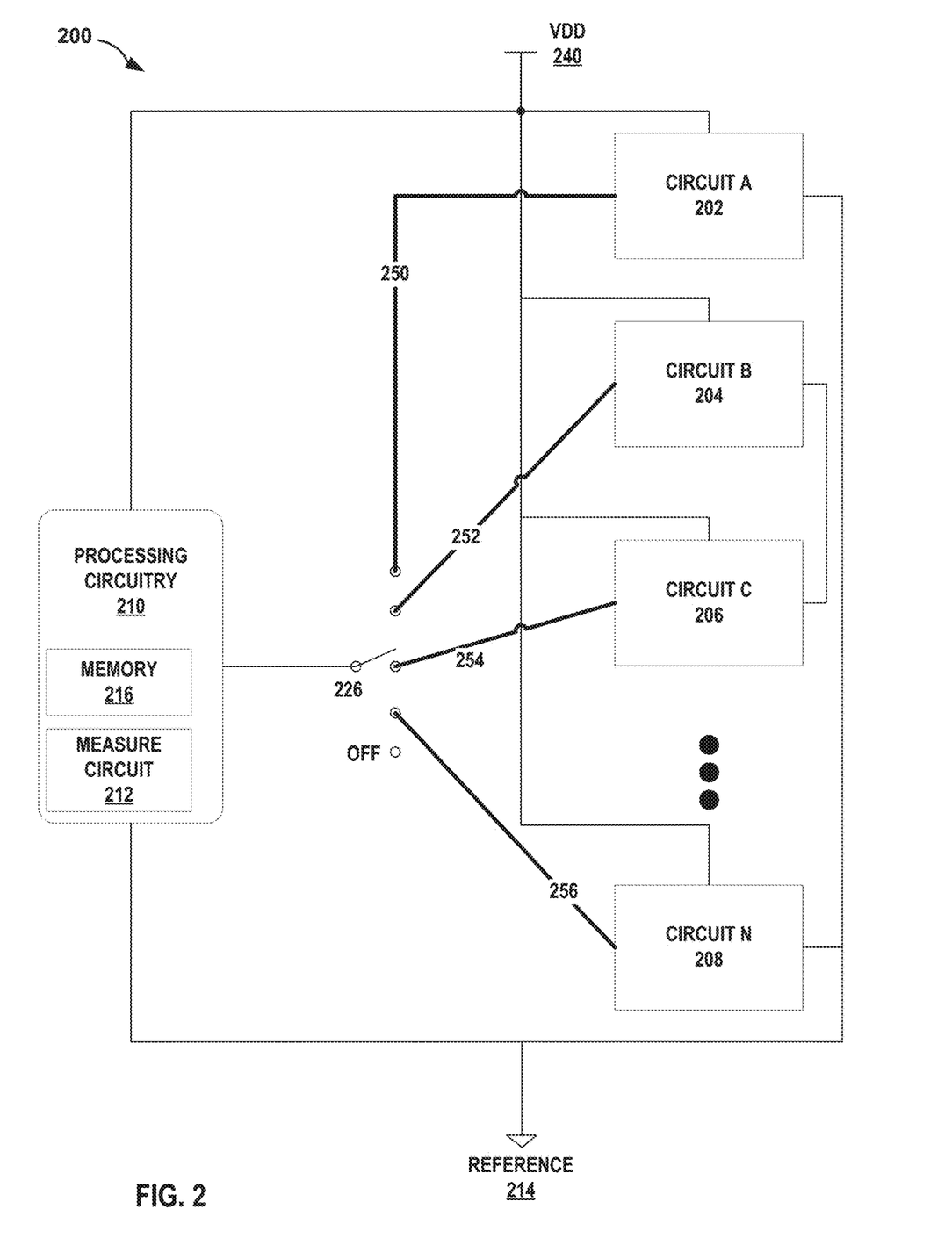
FIG. 2 is a block diagram of a system for measuring characteristics of circuits in the system to monitor the state of health of the ICs, according to one or more techniques of this disclosure.

FIG. 2 is a block diagram of a system for measuring characteristics of circuits in the system to monitor the state of health of the ICs, according to one or more techniques of this disclosure. As described above in relation to FIG. 1, system 200 may be any system performing circuit operations in a variety of applications including vehicles, energy management, controllers, and the like. Also, to simplify the description, the circuits of system 200 may be described as ICs, but as described above in relation to FIG. 1, the techniques of this disclosure may apply to any type of circuits, not necessarily just ICs.

The example of system 200 includes processing circuitry 210 and several circuits 202-208, which may perform various circuit operations and functions for system 200 including motor control, sensing, signal processing, display processing and other functions. Circuits 202-208 may connect to each other, to processing circuitry 210 and to other components, not shown in FIG. 2 with electrical and mechanical connections, also not shown in FIG. 2. Some examples of these functional connections may include communication links, data transfer, sensing lines, other I/O connections and may include mechanical connections. For example, circuit C 206 may include a pneumatic connection to sense pressure (not shown in FIG. 2). Circuits 202-208, and processing circuitry 210 may connect to a power supply Vdd 240 as well as a reference 214.

Processing circuitry may also connect to one or more additional terminals on circuits 202-208 through switch 226. As described above in relation to FIG. 1, each additional terminal may include a circuit test element, which may be located between the circuit and the additional terminal. Measure circuit 212, which may be operatively coupled to processing circuitry 210, may determine a change over time of an electrical characteristic measured at the additional terminal. In some examples, the change over time, or a single measurement, may indicate a state of health of the circuit.

In the example of FIG. 2, each connection 250, 252, 254 and 256 may indicate multiple respective connections to multiple respective additional terminals through switch 226. For example, switch 226 may select an additional terminal connected to a power supply pin, e.g. a Vdd pin, of circuit A 202. Switch 226 may switch from the additional terminal on the power supply pin of circuit A 202 to an additional terminal on a corner pin of circuit A 202, as described above for corner pin 156 in relation to FIG. 1. Similarly, switch 226 may connect measure circuit 212 to any of multiple additional terminals on circuit B 204, circuit C 206 and circuit N 208 at different times. During times of circuit operation in which measure circuit 212 is not taking measurements from the additional pins, switch 226 may be set to the OFF position.

Processing circuitry 210 may be configured to control the operation of measure circuit 212, which is an example of measurement circuitry, such as measure circuit 112 described above in relation to FIG. 1. Measure circuit 212 may be configured to measure one or more electrical characteristics of circuits 202-208. Processing circuitry 210 may also be configured to control circuits 202-208, such as to put any of circuits 202-208 in a state to measure Iddq, as described above in relation to FIG. 1. Processing circuitry 210 may also be configured to store the determined electrical characteristic at a first time and at a second time different from the first time, and determine whether the determined electrical characteristic changed over time.

Examples of processing circuitry 210 may include any one or more of a microcontroller (MCU), e.g. a computer on a single integrated circuit containing a processor core, memory, and programmable input/output peripherals, a microprocessor (μP), e.g. a central processing unit (CPU) on a single integrated circuit (IC), a controller, a digital signal processor (DSP), an application specific integrated circuit (ASIC), a field-programmable gate array (FPGA), a system on chip (SoC), a chiplet based integrated circuit or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry. Accordingly, the terms "processing circuitry," "processor" or "controller." as used herein, may refer to any one or more of the foregoing structures or any other structure operable to perform techniques described herein.

Memory 216 may be operatively coupled to processing circuitry 210. Examples of memory 216 may include any type of computer-readable storage media such as random access memory (RAM), read only memory (ROM), programmable read only memory (PROM), erasable programmable read only memory (EPROM), electronically erasable programmable read only memory (EEPROM), flash memory, and similar devices. In some examples the computer readable storage media may store instructions that cause the processing circuitry to execute the functions described herein. In some examples, the computer readable storage media may store data, such as configuration information, temporary values and other types of data used to perform the functions of this disclosure. Memory 216 may store a history of values measured by measure circuit 212 and the history of values may be used to provide a trend of measured values over time.

In the example of FIG. 2, memory 216 and measure circuit 212 are depicted as part of processing circuitry 210. In other examples, memory 216 and measure circuit 212 may be implemented as separate components and coupled to processing circuitry 210.

Figure 3A:
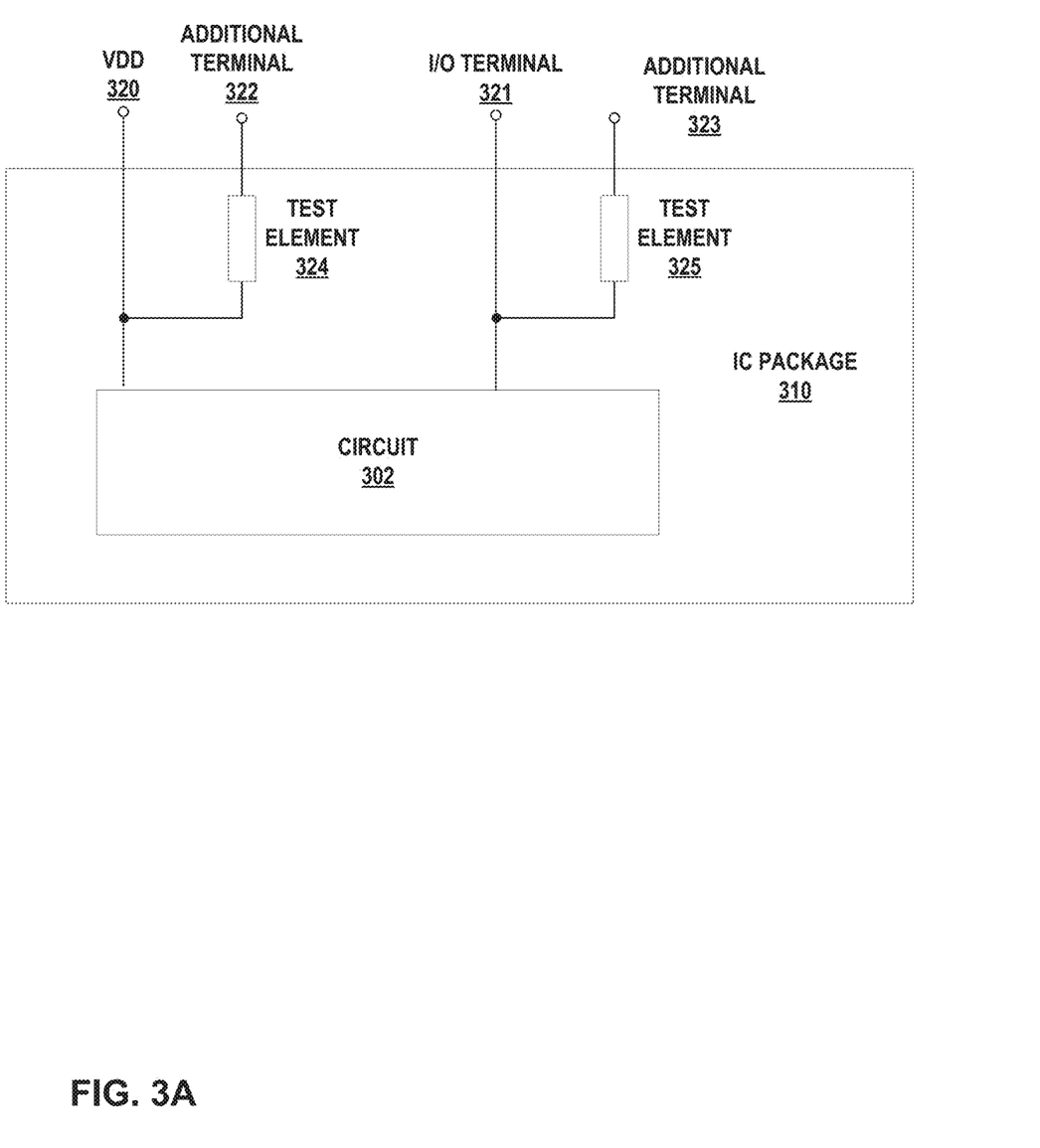
FIG. 3A is a schematic diagram illustrating an example IC package with an additional terminal used to monitor the state of health of the IC, according to one or more techniques of this disclosure.

FIG. 3A is a schematic diagram illustrating an example IC package with an additional terminal used to monitor the state of health of the IC, according to one or more techniques of this disclosure. IC package 310 is an example of circuit package 104 and circuits 202-208 described above in relation to FIGS. 1 and 2 and may have the same functions and characteristics. The examples of FIGS. 3A-4B are depicted as ICs to simplify the description, but the techniques of this disclosure may apply to other types of circuits.

The example of IC package 310 includes circuit 302, power supply terminal Vdd 320, a functional terminal, I/O terminal 321 and additional terminals 322 and 323. Test element 324 is located between additional 322 and Vdd 320. Test element 325 is located between additional terminal 323 and I/O terminal 321. Both Vdd 320 and I/O terminal 321 connect circuit 302 to an external circuit, such as system 100 or system 200 described above in relation to FIGS. 1 and 2.

Test element 324 and test element 325 may be implemented by a variety of components. Some examples may include a resistance or other impedance, a diode, capacitor, inductor, or some combination of components. In the example in which test element 324 is a resistor, measurement circuitry connected to additional terminal 322 may measure a current flowing into Vdd 320. For example, apply a voltage at additional terminal 322, then measure the voltage between Vdd 320 and additional terminal 322 to determine a current. A similar measurement may be done for any kind of circuit with additional pins. Also, by controlling the state of functional terminals of circuit 302, such as I/O terminal 321, measurement circuitry may perform an Iddq measurement of supply current to circuit 302, which may provide an indication of the state of health of circuit 302.

Similarly, by later connecting measurement circuitry to additional terminal 323, for example, by using a switch, the measurement circuitry may determine other electrical characteristics that indicate the state of health of IC package 310. For example, the electrical characteristics may indicate leakage between one or more terminals, degradation of the interface, such as corrosion, delamination, solder cracking and the like, a temperature of IC package 310 and other operating characteristics.

Figure 3B:
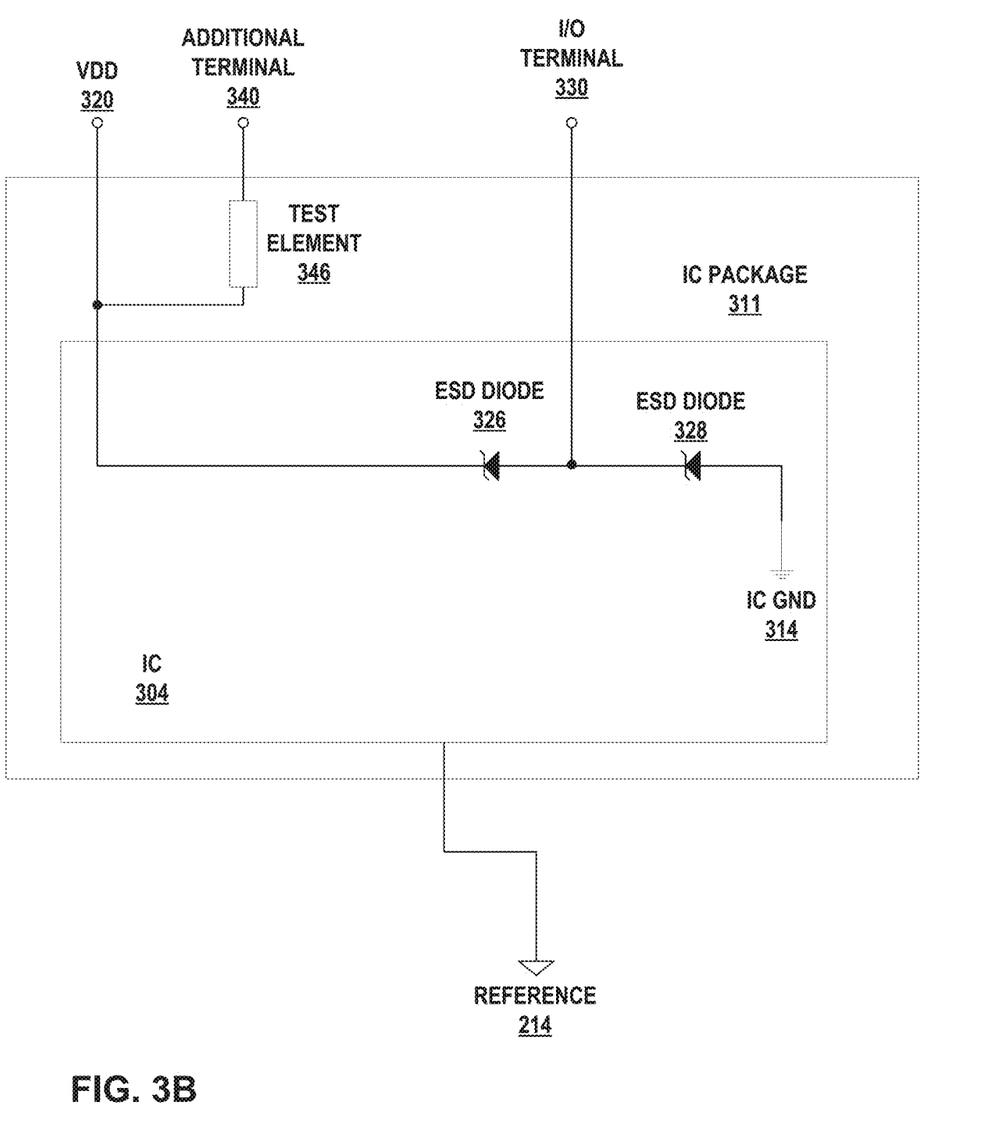
FIG. 3B is a schematic diagram illustrating the use of ESD protection diodes to determine a temperature of the IC as part of monitoring the state of health of the IC.

FIG. 3B is a schematic diagram illustrating the use of ESD protection diodes to determine a temperature of the IC as part of monitoring the state of health of the IC. IC package 311 is an example of circuit package 104, circuits 202-208 and IC package 310 described above in relation to FIGS. 1, 2 and 3 and may have the same functions and characteristics.

The example of IC package 311 includes IC 304, power supply terminal Vdd 320, V/O terminal 330 and additional terminal 340. Test element 346 is located between additional terminal 340 and Vdd 320, similar to IC package 310 described above in relation to FIG. 3A. Both Vdd 320 and I/O terminal 333 connect IC 304 to an external circuit, such as system 100 or system 200 described above in relation to FIGS. 1 and 2. IC 304 depicts ESD protection diodes, e.g. ESD diode 326 and ESD diode 328, which may be included, but are not shown in any of the other circuits described above. In the example of FIG. 3B, the cathode for ESD diode 326 connects to Vdd 320 while the anode of ESD diode 326 connects to I/O terminal 330 and the cathode of ESD diode 328. The anode of ESD diode 328 connects to IC ground 314. In other examples, ESD protection circuitry may include capacitors or other circuitry and may be connected in a different way.

In some examples, ESD diodes, already included in a circuit, may be one example technique that may be used to get an indication of the temperature of the circuit. For example, current that flows into the ESD diode may cause a temperature increase from the power dissipated in the diodes. A particular diode may have a particular thermal resistance that may determine how junction temperatures change as a function of power dissipation.

In some examples, measurement circuitry may determine a trend of temperature changes during circuit operations. An unexpected increase or decrease in temperature may indicate a state of health of circuit package 311. In other examples, the electrical characteristic that indicates the temperature is a first electrical characteristic. The measurement circuitry may also measure a current, such as Iddq or other operating current. Because resistance changes with temperature, changes in measured operating current may be caused by changes in the resistance of, for example, test element 346, rather than caused by an actual change in operating current. In some examples, processing circuitry of the system may calculate an adjustment to the measured operating current based the measured temperature. In other words, the measured temperature of the circuit may provide an adjustment to a second electrical characteristic, such as operating current, where the second electrical characteristic may also provide an indication of the state of health of IC package 311.

Figure 4A:
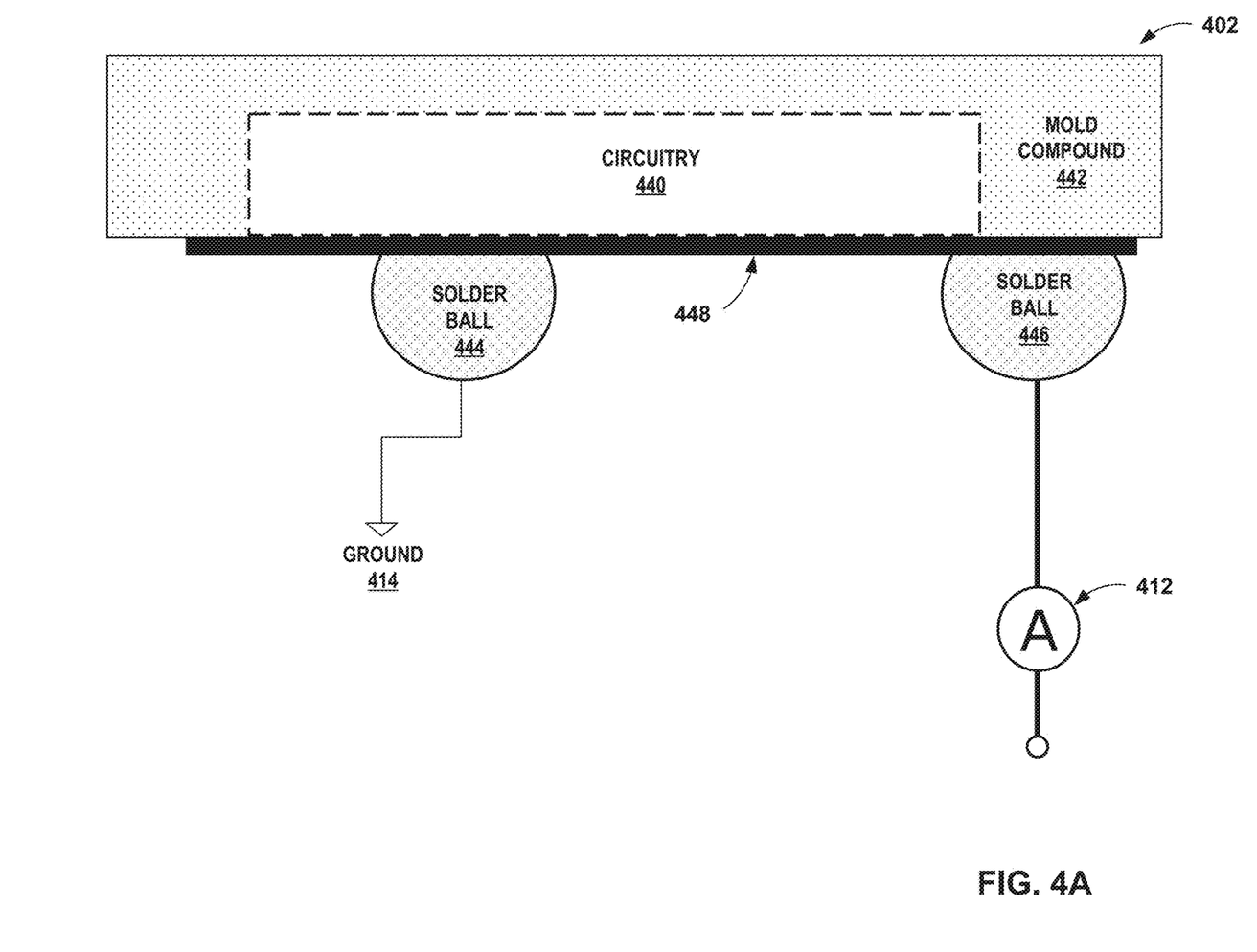
FIG. 4A is a conceptual diagram illustrating the use of a connected terminal of a BGA connected IC to monitor the state of health of the IC, according to one or more techniques of this disclosure.

FIG. 4A is a conceptual diagram illustrating the use of a connected terminal of a BGA (Ball Grid Array) connected IC to monitor the state of health of the IC, according to one or more techniques of this disclosure. IC package 402 is an example of circuit package 104 and circuits 202-208 described above in relation to FIGS. 1 and 2 and may have the same functions and characteristics.

In the example of FIG. 4A, IC package 402 includes circuitry 440, which may be mounted to a substrate (e.g. laminates, leadframes) including redistribution layer (RDL) 448 and encapsulated by mold compound 442. External terminals that connect to circuitry 440 include solder ball 444 and solder ball 446. IC package 402 may include additional connections not shown in FIG. 4A. Though the terminals in the example of FIG. 4A are depicted as solder balls, the techniques described for IC package 402 may apply to other types of connections, such as pillars for a flip chip, or similar connections. Solder ball 444 in the example of FIG. 4A connects to a reference voltage, ground 414. Solder ball 446 may connect to measure circuit 412. In some examples, as described above in relation to FIG. 2, measure circuit 412 may connect to solder ball 446 via a switch (not shown in FIG. 4A). An RDL is an extra metal layer consisting of wiring on top of core metals that makes the I/O pads of the die available for bonding out other locations such as bump pads, which may for example, make chip-to-chip bonding simpler.

In operation, measurement circuitry 412 may apply a voltage to solder ball 446 and measure a current between 446 and ground 414. The magnitude of the current may provide information about open or weak contacts between and from the solder ball 444 and solder ball 446. In other words, measuring the current, as well as changes in the current may provide information about degradation of the interface, which may be caused, for example by long-term thermal changes, vibration or other environmental conditions in the field that may impact the SOH of IC package 402. As described above, a circuit may be subject to metal phase change separation, cause void generation within IC package 402, delamination and breakage of electrical connections such as wire bonds and solder bonds connecting IC package 402 to a system.

Figure 4B:
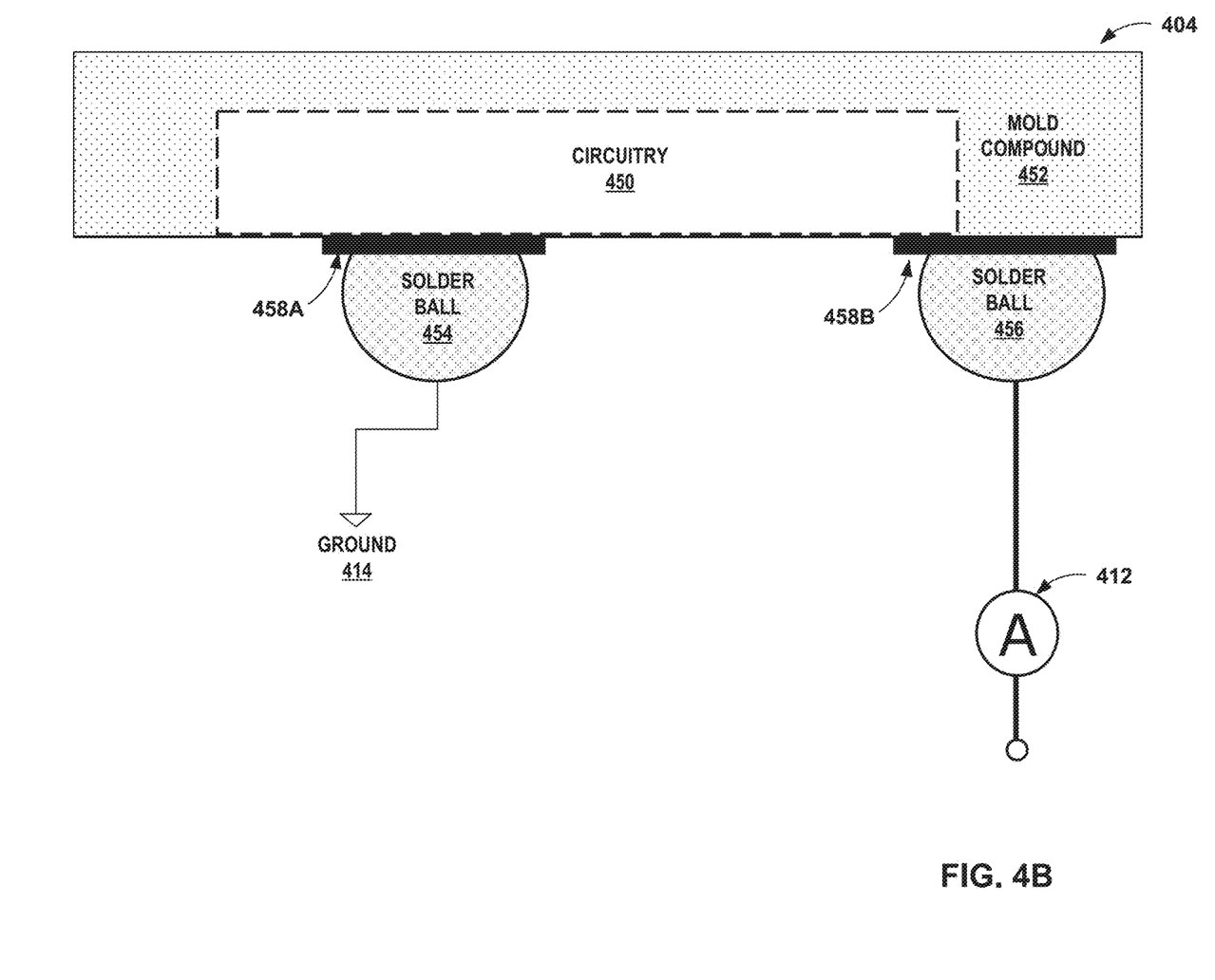
FIG. 4B is a conceptual diagram illustrating the use of an isolated terminal of a BGA connected IC to monitor the state of health of the IC, according to one or more techniques of this disclosure.

FIG. 4B is a conceptual diagram illustrating the use of an isolated terminal of a BGA connected IC to monitor the state of health of the IC, according to one or more techniques of this disclosure. IC package 404 is an example of circuit package 104 and circuits 202-208 described above in relation to FIGS. 1 and 2 and may have the same functions and characteristics.

In the example of FIG. 4B. IC package 404 includes circuitry 450, which may be mounted to a substrate (e.g. laminates and leadframes) including RDL 448A and encapsulated by mold compound 452. External terminals that connect to circuitry 440 include solder ball 454, and IC package 404 may include additional connections not shown in FIG. 4B. IC package 404 also includes isolated solder ball 456, which may connect to a portion of the leadframe 458B. In the example of FIG. 4B, solder ball 456 is isolated from solder ball 454. Measure circuit 412 may connect to solder ball 456. As with solder ball 446 described above in relation to FIG. 4A, in some examples, solder ball 456 may be placed at a location that may be subject to mechanical stress.

Similar to FIG. 4A, in operation, measurement circuitry 412 may apply a voltage, including an AC voltage, to solder ball 446 and measure a current between 456 and ground 414. The magnitude of the current measured by measure circuit 412 may provide information about leakage between solder ball 456 and solder ball 454. In some examples, leakage may be caused by creepage, which is the leakage of an electrical current across the surface of an insulator or dielectric, such as the surface of a printed circuit board (PCB) to which solder balls 454 and 456 are connected, or across the surface of mold compound 452. In other examples, mold compound 452 may absorb contaminants from the environment, including moisture, and current may leak through portions of mold compound 452. In the example of FIG. 4B, the circuit test element, described above in relation to FIGS. 3A and 3B, may be an inherent impedance of the surface of the PCB or encapsulant, or may be the encapsulant itself, e.g. mold compound 452.

Figure 5:
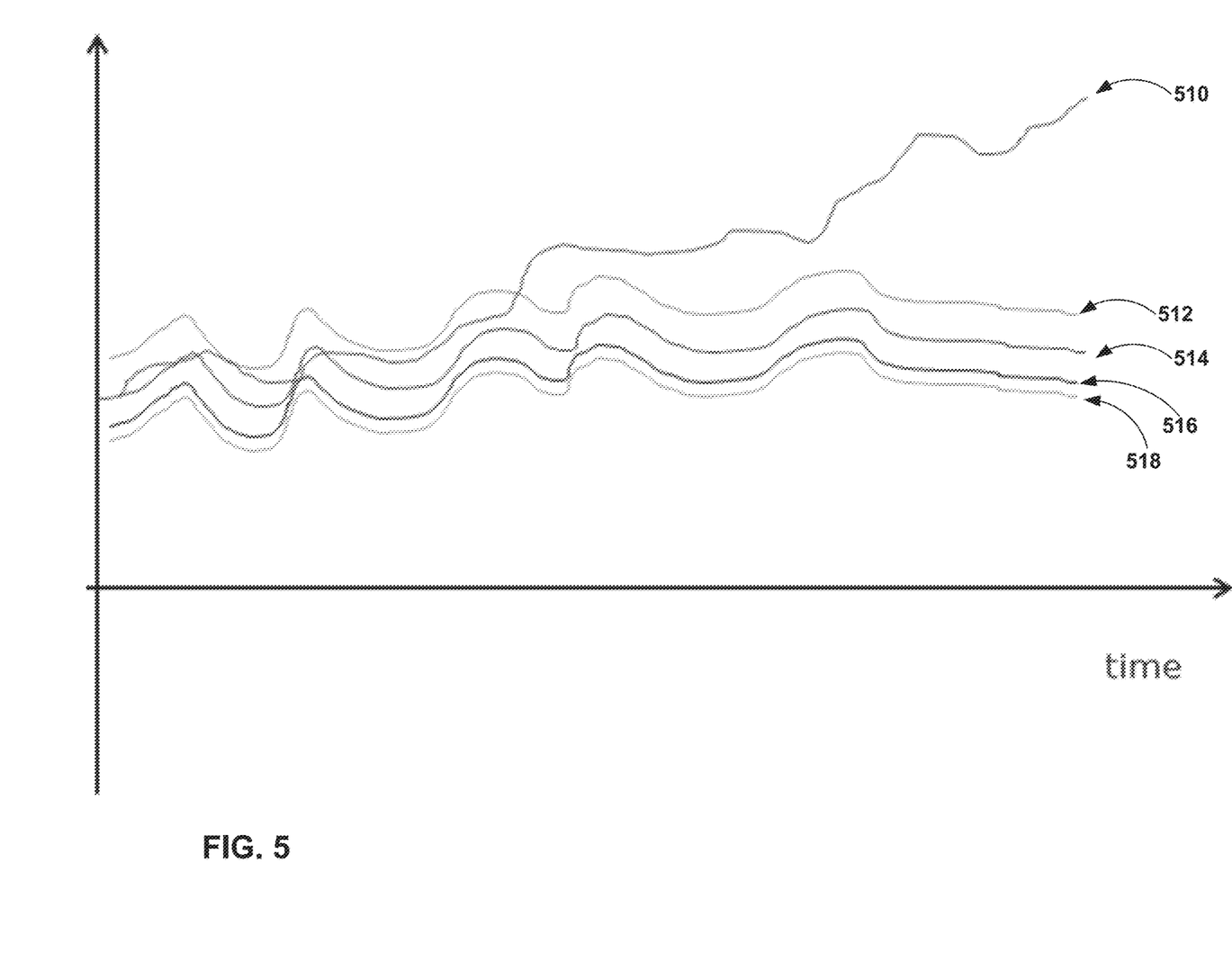
FIG. 5 is a time graph illustrating an example of monitoring an electrical characteristic over time to determine the state of health of an IC according to one or more techniques of this disclosure.

FIG. 5 is a time graph illustrating an example of monitoring an electrical characteristic over time to determine the state of health of an IC according to one or more techniques of this disclosure. FIG. 5 may illustrate an example of measuring an electrical characteristic of circuits 202-208 of system 200 over time, as described above in relation to FIG. 2. For example, graphs 510, 512, 514, 516 and 518 may represent a measurement of temperature of each circuit taken while the circuits are performing normal circuit operations in the field. As shown in in FIG. 5, the temperatures measured by the measuring circuitry of the system may increase and decrease overtime based on, for example, changes in environment, operating modes or for other reasons.

Each of the graphs 512-518 have a different magnitude, but all follow a similar pattern. The electrical characteristic of graph 510 is clearly much different than the other circuits, which may indicate an impending malfunction or failure. In this manner, the additional terminal on each of the circuits may provide the system the observability to determine that the state of health for each of circuits represented by graphs 512-518 may be within expected standards, but the state of health of the circuit of graph 510 may be deteriorating. In response, the system may provide an alarm, send a communication to another system or take some other action to indicate that one of the circuits may be in need of attention or replacement.

Figure 6:
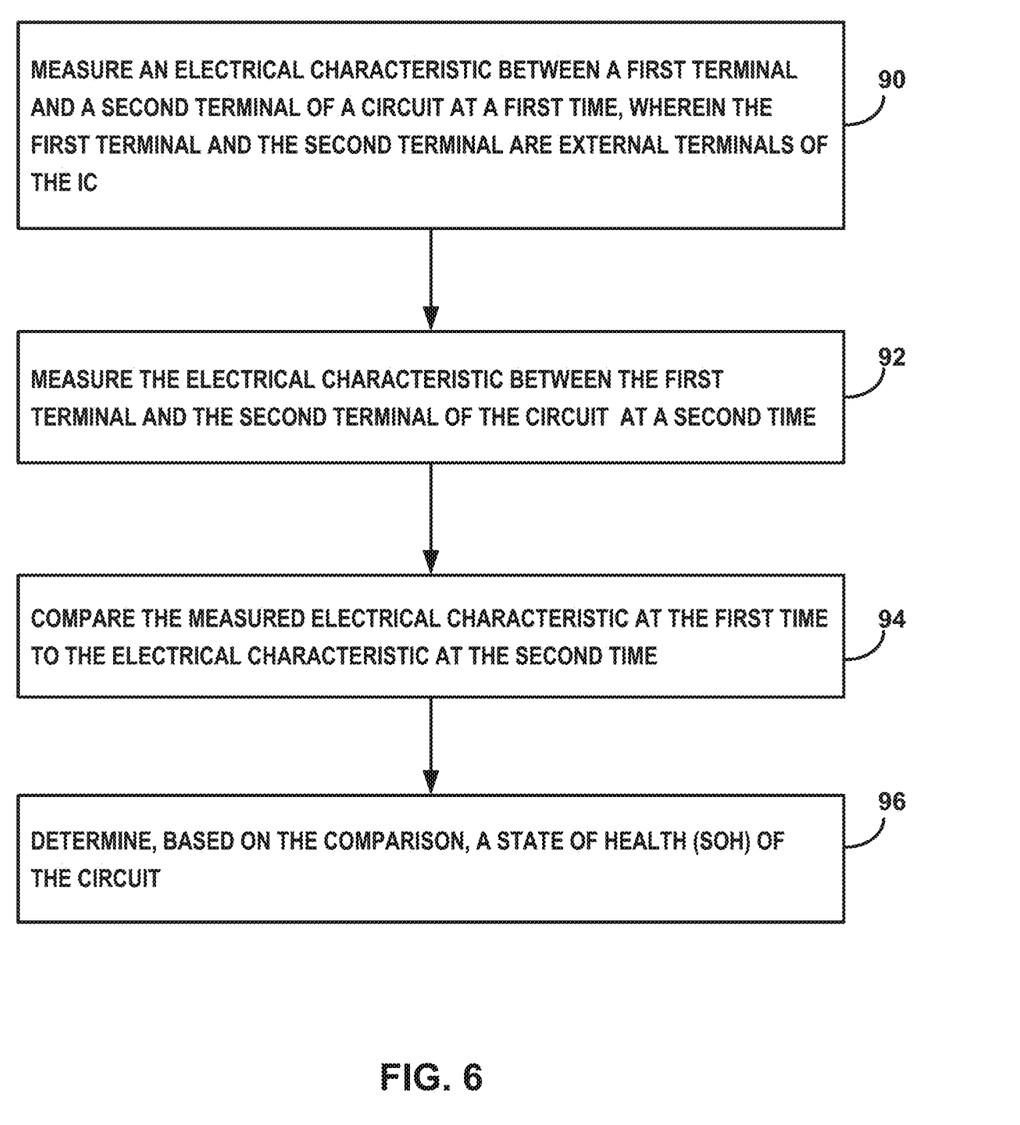
FIG. 6 is a flow diagram illustrating an example operation of a system of this disclosure.

FIG. 6 is a flow diagram illustrating an example operation of a system of this disclosure. The blocks of FIG. 6 will be described in terms of FIGS. 2 and 3A, unless otherwise noted.

A system may connect a measurement device, such as measure circuit 212 to a first pin of a circuit, such as to a power supply terminal, Vdd 320 of circuit package 310. The circuit package may be configured to perform one or more circuit operations outside of a test environment, e.g. in the field such as installed in a vehicle or other system. The system may connect the measurement device to an additional terminal. e.g. additional terminal 322, which may include circuit test element 324 (90). In other words, additional terminal 322 connects to the first terminal through test element 324. As described above in relation to FIG. 4B, in some examples the test element may be an inherent portion of the additional terminal. In the example of FIG. 3A, circuit test element 324 is located between the power supply terminal, Vdd 320 of circuit package 310 and additional terminal 322. Measure circuit 212 may measure an electrical characteristic between the first terminal, e.g. power supply terminal Vdd 320, and additional terminal 322 at a first time (90). As described above in relation to FIG. 2, measure circuit 212 may take several measurements of circuit A 202, followed by several measurements of circuit B 204, and so on. The results of the measurements may be stored at memory 216.

Measure circuit 212 may further measure the electrical characteristic between power supply terminal Vdd 320 and additional terminal 322 at a second time subsequent to the first time, as depicted by FIG. 5 (92). In some examples, processing circuitry of the system may compare the electrical characteristic determined at the first time to the electrical characteristic determined at the second time (94). In some examples, the processing circuitry may also compare the result to a change threshold or delta threshold, which may determine whether the amount of change exceeds the change threshold. In other examples, the processing circuitry may compare the measured value to a magnitude threshold, for example, to an overcurrent threshold. In other examples, processing circuitry may compare a measured value to a count threshold, such as the number of times a circuit has exceed an overcurrent limit. As described above in relation to FIG. 5, processing circuitry may determine a state of health of the circuit package based on a change in the electrical characteristic determined at the first time to the electrical characteristic determined at the second time, or by comparison to some other threshold value (96).

The techniques of this disclosure may also be described in the following examples.

Example 1

A device comprises a device comprising: a circuit configured to perform one or more circuit operations, and an additional terminal comprising a circuit test element, wherein the circuit test element is located between the circuit and the additional terminal, and wherein a change over time of a measured electrical characteristic at the additional terminal indicates a state of health (SOH) of the circuit.

Example 2

The device of example 1, wherein a change over time of the measured electrical characteristic between the additional terminal and the power supply terminal indicates a state of health of the circuit while the circuit is performing the one or more circuit operations.

Example 3

The device of any of examples 1-2 or any combination thereof, wherein the circuit test element comprises a resistor, and wherein the measured electrical characteristic is a voltage.

Example 4

The device of any combination of examples 1-3, the device further comprising a power supply terminal, wherein the voltage between the additional terminal and the power supply terminal indicates a current at the power supply terminal while the IC is performing the one or more circuit operations.

Example 5

The device of any combination of examples 1-4, wherein the circuit test element comprises a diode.

Example 6

The device of any combination of examples 1-5, wherein the measured electrical characteristic indicates a temperature of the circuit at the additional terminal.

Example 7

The device of any combination of examples 1-6, wherein the electrical characteristic is a first electrical characteristic, wherein the temperature of the circuit provides an adjustment to a second electrical characteristic, and wherein the second electrical characteristic also provides an indication of the state of health of the IC package.

Example 8

The device of any combination of examples 1-7, further comprising one or more diodes, wherein the one or more diodes are configured to: provide protection for the IC from electro-static discharge (ESD), provide a temperature of the IC.

Example 9

The device of any combination of examples 1-8, wherein the circuit is an integrated circuit (IC).

Example 10

The device of any combination of examples 1-9, wherein the circuit comprises a complementary metal oxide semiconductor (CMOS) circuit.

Example 1

The device of any combination of examples 1-10, wherein the device comprises an IC package and, wherein the additional terminal is located at a position on the IC package that is more vulnerable to connection damage than other external terminals on the IC package.

Example 12

The device of any combination of examples 1-11, wherein the additional terminal is located at a corner position on the IC package.

Example 13

The device of any combination of examples 1-12, wherein the additional terminal is a corner ball of a ball-grid array (BGA).

Example 14

The device of any combination of examples 1-13, wherein the additional terminal is electrically connected to a redistribution layer (RDL) of the IC package and the circuit test element comprises the RDL.

Example 15

The device of any combination of examples 1-14, wherein the additional terminal is electrically isolated from a redistribution layer (RDL) of the IC package.

Example 16

The device of any combination of examples 1-15, wherein the IC package further comprises an encapsulant, wherein the circuit test element comprises the encapsulant, and wherein the additional terminal is configured to detect leakage through the encapsulant of the IC package.

Example 17

The device of any combination of examples 1-16, wherein the additional terminal is subject to mechanical stress or degradation of interface.

Example 18

A system comprising: a circuit package comprising: a circuit, the circuit configured to perform one or more circuit operations, an additional terminal comprising a circuit test element. The circuit test element is located between the circuit and the additional terminal, and a change over time of an electrical characteristic measured at the additional terminal indicates a state of health (SOH) of the circuit package. The system further includes a measurement device configured to: measure the electrical characteristic, and electrically connect to the additional terminal, wherein the measurement device is configured to determine the change over time of the electrical characteristic while the circuit is performing the one or more circuit operations.

Example 19

The system of example 18, wherein the measurement device is configured to determine an indication of power supply quiescent current (IDDQ) based on the measured electrical characteristic when the circuit: is not switching, and the inputs are held at constant values.

Example 20

The system of any combination of examples 18-19, further comprising processing circuitry configured to: control the operation of the measurement circuitry, store the determined electrical characteristic at a first time and at a second time different from the first time, and determine whether the determined electrical characteristic changed over time.

Example 21

The system of any combination of examples 18-20, further comprising a computer readable storage medium configured to store a history of the determined electrical characteristic over time.

Example 22

The system of any combination of examples 18-21, wherein the circuit package is a first circuit package, the system further comprising: a second circuit package including a power supply terminal and a second additional terminal comprising a second circuit test element, the second circuit package configured to perform one or more circuit operations, a switch configured: to be controlled by the processing circuitry, to connect the measurement device to the additional terminal of first circuit package at a first time, to connect the measurement device to the power supply terminal and the second additional terminal of second circuit package at a second time different from the first time.

Example 23

The system of any combination of examples 18-22, wherein the measurement device is configured to determine a temperature of the circuit package based on determining the electrical characteristic.

Example 24

The system of any combination of examples 18-23, wherein the temperature of the circuit package provides an adjustment to the indication of the state of health of the circuit package.

Example 25

A method comprising: connecting a measurement device to a power supply terminal of a circuit package configured to perform one or more circuit operations outside of a test environment, connecting the measurement device to an additional terminal comprising a circuit test element, wherein the circuit test element is located between the power supply terminal of the circuit package and the additional terminal, measuring an electrical characteristic between the power supply terminal and the additional terminal at a first time, measuring the electrical characteristic between the power supply terminal and the additional terminal at a second time subsequent to the first time, comparing the electrical characteristic determined at the first time to the electrical characteristic determined at the second time, determining a state of health (SOH) of the circuit package outside of the test environment based on a change in the electrical characteristic determined at the first time to the electrical characteristic determined at the second time.

Example 26

The method of example 25, wherein the circuit test element comprises a resistance and the measured electrical characteristic comprises a voltage, the method further comprising: in response to measuring the voltage at the first time, determining a current drawn by the power supply terminal at the first time based on the measured voltage at the first time, in response to measuring the voltage at the second time, determining the current drawn by the power supply terminal at the second time based on the measured voltage at the second time, comparing the current determined at the first time to the current determined at the second time, determining a state of health of the circuit package outside of the test environment based on a change in the current determined at the first time to the current determined at the second time.

Example 27

The method of any combination of examples 25-26, wherein monitoring the voltage between the additional terminal and the power supply terminal when circuitry of the circuit is not switching and the inputs are held at constant values provides an indication of power supply quiescent current (IDDQ) outside of the test environment.

Various examples of the disclosure have been described. These and other examples are within the scope of the following claims.

The invention claimed is:
1. A device comprising:
a circuit configured to perform one or more circuit operations;

a circuit test element; and
an additional terminal,
wherein the circuit test element is located between the circuit and the additional terminal, and
wherein a change over time of a measured electrical characteristic at the additional terminal indicates a state of health (SOH) of the circuit.

2. The device of claim 1, wherein the change over time of the measured electrical characteristic while the circuit is performing the one or more circuit operations indicates the state of health of the circuit.

3. The device of claim 1,
wherein the circuit test element comprises a resistor, and
wherein the measured electrical characteristic is a voltage.

4. The device of claim 3, the device further comprising a power supply terminal, wherein the voltage between the additional terminal and the power supply terminal indicates a current at the power supply terminal while the circuit is performing one or more circuit operations.

5. The device of claim 1, wherein the circuit test element comprises a diode.

6. The device of claim 5, wherein the measured electrical characteristic indicates a temperature of the circuit at the additional terminal.

7. The device of claim 6
wherein the electrical characteristic is a first electrical characteristic,
wherein the temperature of the circuit provides an adjustment to a second electrical characteristic, and
wherein the second electrical characteristic also provides an indication of the state of health of the circuit.

8. The device of claim 1, further comprising one or more diodes,
wherein the one or more diodes are configured to:
provide protection for the circuit from electro-static discharge (ESD),
provide a temperature of the circuit.

9. The device of claim 1, wherein the circuit is an integrated circuit (IC).

10. The device of claim 9 wherein the circuit comprises a complementary metal oxide semiconductor (CMOS) circuit.

11. The device of claim 9,
wherein the device comprises an IC package and,
wherein the additional terminal is located at a position on the IC package that is more vulnerable to connection damage than other external terminals on the IC package.

12. The device of claim 11, wherein the additional terminal is located at a corner position on the IC package.

13. The device of claim 12, wherein the additional terminal consists of a corner ball of a ball grid array, a corner of a sinterlayer, a corner pillar or a corner bump.

14. The device of claim 9, wherein the additional terminal is electrically connected to a redistribution layer (RDL) of the IC package and the circuit test element comprises the RDL.

15. The device of claim 9, wherein the additional terminal is electrically isolated from a redistribution layer (RDL) of the IC package.

16. The device of claim 15,
wherein the IC package further comprises an encapsulant,
wherein the circuit test element is enclosed by the encapsulant, and
wherein the additional terminal is configured to detect leakage at the encapsulant of the IC package.

17. The device of claim 11, wherein the additional terminal is subject to mechanical stress or degradation of interface.

18. A system comprising:
a circuit package comprising:
a circuit, the circuit configured to perform one or more circuit operations;
a circuit test element;
an additional terminal,
wherein the circuit test element is located between the circuit and the additional terminal, and
wherein a change over time of an electrical characteristic measured at the additional terminal indicates a state of health (SOH) of the circuit package; and
measurement circuitry configured to:
measure the electrical characteristic; and
electrically connect to the additional terminal,
wherein the measurement circuitry is configured to determine the change over time of the electrical characteristic while the circuit is performing the one or more circuit operations.

19. The system of claim 18, wherein the measurement circuitry is configured to determine an indication of power supply quiescent current (IDDQ) based on the measured electrical characteristic when the circuit:
is not switching, and
inputs to the circuit are held at constant values.

20. The system of claim 18, further comprising processing circuitry configured to:
control the operation of the measurement circuitry;
store the measured electrical characteristic at a first time and at a second time different from the first time; and
determine whether the measured electrical characteristic changed over time.

21. The system of claim 20, further comprising a computer readable storage medium configured to store a history of the determined electrical characteristic over time.

22. The system of claim 20, wherein the circuit package is a first circuit package, the system further comprising:
a second circuit package including a power supply terminal and a second additional terminal comprising a second circuit test element, the second circuit package configured to perform one or more circuit operations;
a switch configured:
to be controlled by the processing circuitry;
to connect the measurement circuitry to the additional terminal of first circuit package at a first time;
to connect the measurement circuitry to the power supply terminal and the second additional terminal of second circuit package at a second time different from the first time.

23. The system of claim 18, wherein the measurement circuitry is configured to determine a temperature of the circuit package based on determining the electrical characteristic.

24. The system of claim 23, wherein the temperature of the circuit package provides an adjustment to the indication of the state of health of the circuit package.

25. A method comprising:
connecting a measurement circuitry to a power supply terminal of a circuit package, wherein the circuit package is configured to perform one or more circuit operations outside of a test environment;
connecting the measurement circuitry to an additional terminal, wherein a circuit test element is located between the power supply terminal of the circuit package and the additional terminal;

measuring an electrical characteristic between the power supply terminal and the additional terminal at a first time;

measuring the electrical characteristic between the power supply terminal and the additional terminal at a second time subsequent to the first time;

comparing the electrical characteristic determined at the first time to the electrical characteristic determined at the second time;

determining a state of health (SOH) of the circuit package outside of the test environment based on a change in the electrical characteristic determined at the first time to the electrical characteristic determined at the second time.

26. The method of claim 25, wherein the circuit test element comprises a resistance and the measured electrical characteristic comprises a voltage, the method further comprising:

in response to measuring the voltage at the first time, determining a current drawn by the power supply terminal at the first time based on the measured voltage at the first time;

in response to measuring the voltage at the second time, determining the current drawn by the power supply terminal at the second time based on the measured voltage at the second time;

comparing the current determined at the first time to the current determined at the second time;

determining a state of health of the circuit package outside of the test environment based on a change in the current determined at the first time to the current determined at the second time.

27. The method of claim 26, wherein monitoring the voltage between the additional terminal and the power supply terminal when circuitry of the circuit is not switching and inputs to the circuit are held at constant values provides an indication of power supply quiescent current (IDDQ) outside of the test environment.

28. The method of claim 26, further comprising:

connecting to an external terminal of the circuit package separate from the power supply terminal, wherein the external terminal is located at a position on the circuit package that is more vulnerable to connection damage than other external terminals on the circuit package;

determining a second current drawn by the external terminal at the third time;

determining a second current drawn by the external terminal at a fourth time subsequent to the third time;

determining a state of health (SOH) of the circuit package outside of the test environment based on a change in the second current determined at the third time to the second current determined at the fourth time.

* * * * *